(12) United States Patent
Minnich et al.

(10) Patent No.: US 10,998,208 B2
(45) Date of Patent: May 4, 2021

(54) COLD FLUID SEMICONDUCTOR DEVICE RELEASE DURING PICK AND PLACE OPERATIONS, AND ASSOCIATED SYSTEMS AND METHODS

(71) Applicant: Micron Technology, Inc., Boise, ID (US)

(72) Inventors: Jeremy E. Minnich, Boise, ID (US); Benjamin L. McClain, Boise, ID (US); Travis M. Jensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/460,956

(22) Filed: Jul. 2, 2019

(65) Prior Publication Data
US 2019/0326142 A1    Oct. 24, 2019

Related U.S. Application Data

(63) Continuation of application No. 16/020,625, filed on Jun. 27, 2018, now Pat. No. 10,410,891, which is a
(Continued)

(51) Int. Cl.
*H01L 21/67* (2006.01)
*H01L 21/683* (2006.01)
(Continued)

(52) U.S. Cl.
CPC ...... *H01L 21/67132* (2013.01); *B28D 5/0017* (2013.01); *B28D 5/0041* (2013.01); *H01L 21/6836* (2013.01); *H05K 13/0061* (2013.01); *H01L 2221/68327* (2013.01); *H01L 2221/68381* (2013.01); *H01L 2221/68386* (2013.01);
(Continued)

(58) Field of Classification Search
CPC ......... Y10T 156/1179; Y10T 156/1983; H01L 21/6835; H01L 21/6836; H01L 2221/68304–68395; H01L 2221/68354; H01L 2221/68381; H05K 13/04–0404; H05K 13/0061
See application file for complete search history.

(56) References Cited

U.S. PATENT DOCUMENTS 10,090,177 B1    10/2018 Minnich et al.
2002/0187589 A1  12/2002 Tsujimoto
(Continued)

*Primary Examiner* — Selim U Ahmed
*Assistant Examiner* — Evan G Clinton
(74) *Attorney, Agent, or Firm* — Perkins Coie LLP

(57) ABSTRACT

Systems and methods for releasing semiconductor dies during pick and place operations are disclosed. In one embodiment, a system for handling semiconductor dies comprises a support member positioned to carry at least one semiconductor die releasably attached to a support substrate. The system further includes a picking device having a pick head coupleable to a vacuum source and positioned to releasably attach to the semiconductor die at a pick station. The system still further includes a cooling member coupleable to a cold fluid source and configured to direct a cold fluid supplied by the cold fluid source toward the support substrate at the pick station. The cold fluid cools a die attach region of the substrate where the semiconductor die is attached to the substrate to facilitate removal of the semiconductor die.

17 Claims, 7 Drawing Sheets

Related U.S. Application Data continuation of application No. 15/687,015, filed on Aug. 25, 2017, now Pat. No. 10,090,177.

(51) Int. Cl.
  *H05K 13/00*  (2006.01)
  *B28D 5/00*  (2006.01)
  *H05K 13/04*  (2006.01)

(52) U.S. Cl.
  CPC ..... *H05K 13/0404* (2013.01); *Y10T 156/1911* (2015.01); *Y10T 156/1983* (2015.01)

(56) References Cited

U.S. PATENT DOCUMENTS

| | | |
|---|---|---|
| 2011/0084377 A1 | 4/2011 | Chien et al. |
| 2016/0133500 A1 | 5/2016 | Morimoto et al. |
| 2017/0133243 A1 | 5/2017 | Thallner |
| 2018/0122682 A1* | 5/2018 | Lee .................... H01L 21/6838 |

* cited by examiner

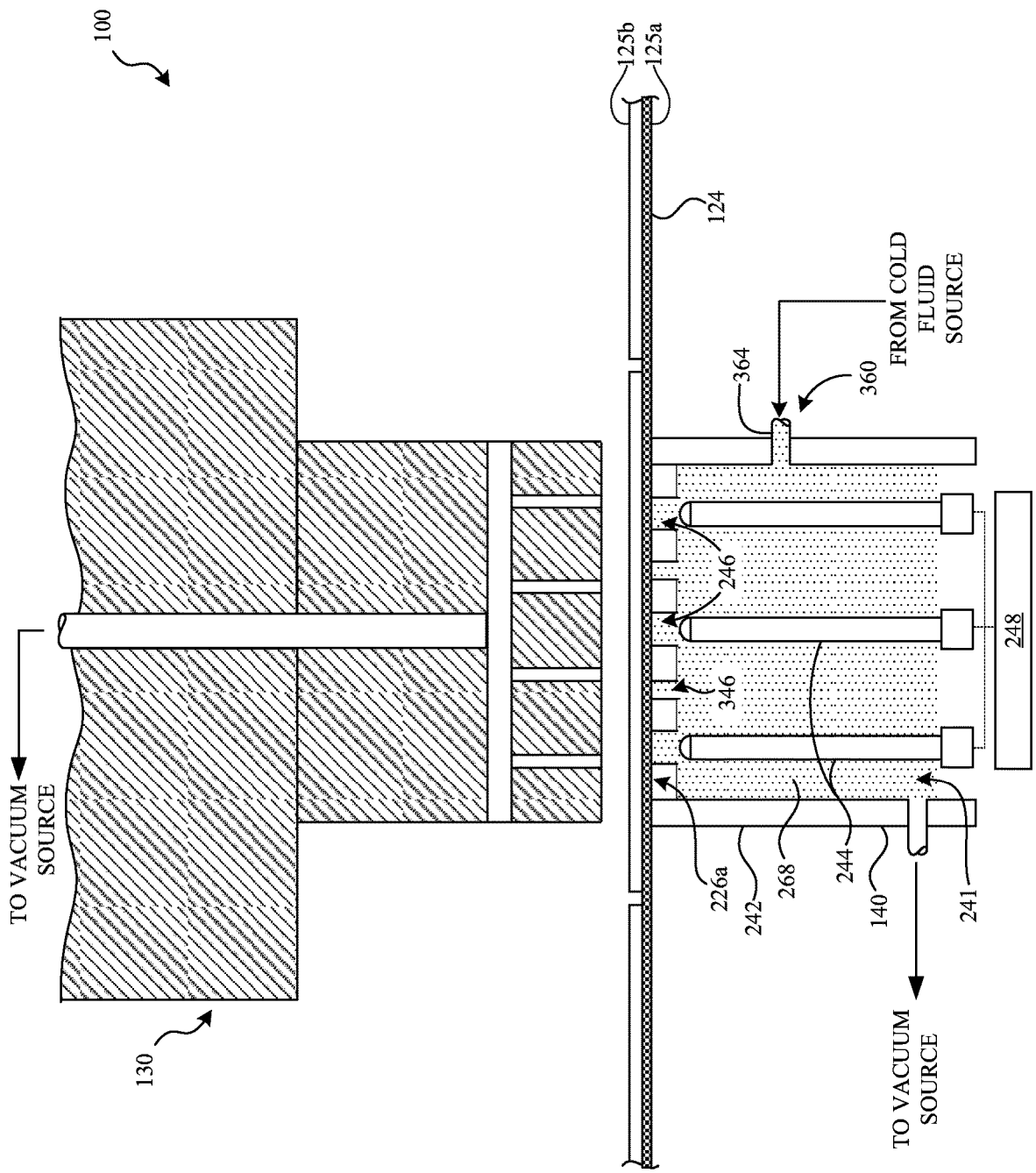

COLD FLUID SEMICONDUCTOR DEVICE RELEASE DURING PICK AND PLACE OPERATIONS, AND ASSOCIATED SYSTEMS AND METHODS

CROSS-REFERENCE TO RELATED APPLICATIONS

This application is a continuation of U.S. patent application Ser. No. 16/020,625, filed Jun. 27, 2018; which is a continuation of U.S. patent application Ser. No. 15/687,015, filed Aug. 25, 2017, now U.S. Pat. No. 10,090,177; each of which is incorporated herein by reference in its entirety.

TECHNICAL FIELD

The present technology is directed generally to systems and methods for releasing semiconductor devices during pick and place operations.

BACKGROUND

Packaged semiconductor dies, including memory chips, microprocessor chips, and imager chips, typically include a semiconductor die, mounted on a substrate and (optionally) encased in a protective covering (e.g., a molded material, encapsulant, plastic, etc.). The die includes functional features, such as memory cells, processor circuits, and/or imager devices, as well as bond pads electrically connected to these functional features. The bond pads can be electrically connected to outside terminals to allow the die to be connected to other devices (e.g., higher level circuitry).

During a conventional manufacturing process, many semiconductor dies are manufactured together on a semiconductor wafer, which is then singulated or diced to form individual dies. Once the dies have been singulated, they are typically handled by "pick and place" machines that remove the individual dies and place them at processing stations or other locations for additional manufacturing steps. As semiconductor devices have become smaller and smaller, the ability to handle individual dies without breaking them, particularly during the pick and place process, has become more challenging. Accordingly, there remains a need in the art for pick and place devices that can handle extremely thin semiconductor dies without breaking or otherwise damaging the dies.

BRIEF DESCRIPTION OF THE DRAWINGS

FIG. 3 is a partially schematic, enlarged, cross-sectional view of a portion of the system shown in FIG. 1, including a cooling member configured in accordance with another embodiment of the present technology.

DETAILED DESCRIPTION

Specific details of several embodiments of semiconductor device handling systems for releasing semiconductor devices (e.g., semiconductor dies) from a dicing tape, or other support substrate, are described below. In several of the embodiments described below, a semiconductor handling system includes a cooling member configured to cool the support substrate to loosen or release the bond(s) holding a semiconductor die to the support substrate, before the semiconductor die is removed from the support substrate. For example, some embodiments include directing a gaseous or liquid cold fluid toward a die attach region of the support substrate proximate to where the semiconductor die is attached to the substrate, to loosen a bond between the semiconductor die and an underlying layer of dicing tape. When a pick and place system lifts the die from the dicing tape, the die is less likely to break due to the preceding process of loosening the bond. Accordingly, the yield of intact dies or other semiconductor devices handled by systems configured in accordance with the present technology is expected to be greater than for conventional systems.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
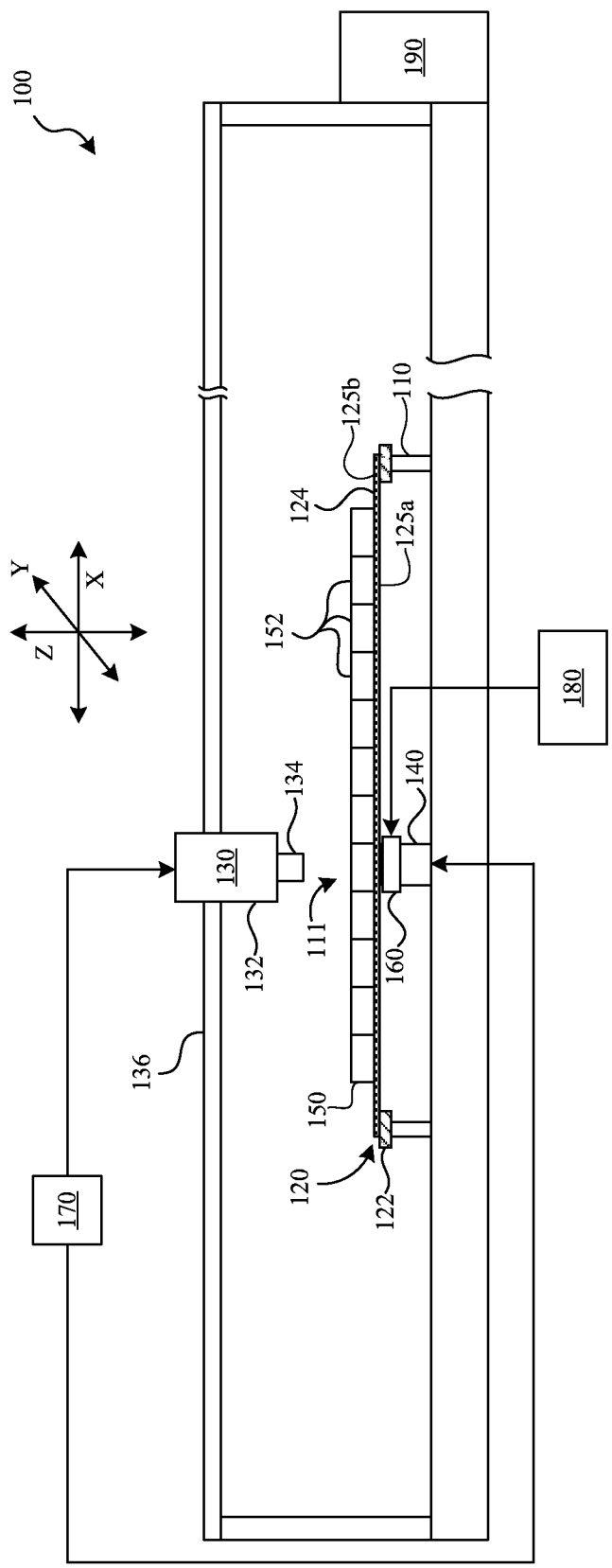
FIG. 1 is a partially schematic side view of a semiconductor die handling system in accordance with an embodiment of the present technology.

FIG. 1 is a partially schematic side view of a semiconductor device handling system 100 ("system 100") configured to "pick and place" semiconductor devices in accordance with embodiments of the present technology. The system 100 includes a support member 110 that carries a support substrate 120 having a lower surface 125a and an upper surface 125b. A semiconductor device 150 is releasably attached to the upper surface 125b of the support substrate 120 and includes a plurality of semiconductor dies 152. A picking device 130 is positionable above the support substrate 120 at a pick station 111 for removing (e.g., "picking") individual semiconductor dies 152 from the support substrate 120 at the pick station 111. An ejector device 140 is positionable below the support substrate 120 at the pick station 111 for facilitating the picking process. The system 100 further includes a cooling member 160 configured to direct a release fluid (e.g., a cold fluid) toward the support substrate 120 and/or semiconductor device 150 at the pick station 111 to aid in loosening, releasing, or at least partially releasing the semiconductor dies 152 from the support substrate 120 prior to the picking device 130 removing the semiconductor dies 152. This is expected to reduce damage to the semiconductor dies 152 from the pick and place process as compared to conventional pick and places systems.

In a particular embodiment, the support substrate 120 includes a dicing frame 122 that carries a sheet of dicing tape 124 having the lower surface 125a and upper surface 125b. The semiconductor device 150 is releasably attached to the upper surface 125b of the dicing tape 124. As illustrated in FIG. 1, the dicing frame 122 can have an annular shape such that all or a portion of the semiconductor device 150 is over only the dicing tape 124. Therefore, the lower surface 125a of the dicing tape 124 can be exposed below the semiconductor device 150. The dicing tape 124 can include a UV-cured, cross-linked material that engages with the semiconductor device via electrostatic forces, mechanical forces (by conforming to topographical features on the backside of the semiconductor device 150), and/or other forces. In some embodiments, the semiconductor device 150 is a semiconductor wafer that has been diced or singulated to form the individual semiconductor dies 152 before the picking device 130 performs a pick and place operation.

The picking device 130 can include a pick head 132 having a pick tip 134 which contacts the semiconductor dies 152 prior to removal. The pick head 132 can be coupled to a vacuum source 170, which allows the pick tip 134 to releasably engage with individual semiconductor dies 152 via a suction or vacuum force. Prior to lifting an individual semiconductor die 152 away from the support substrate 120, the ejector device 140 can push the individual semiconductor die 152 upwardly relative to its neighbors, to facilitate removing just one die 152 at a time.

The system 100 can further include components for selectively holding the support substrate 120 and/or the semiconductor device 150 in position. For example, in some embodiments, the ejector device 140 can be coupled to the vacuum source 170 such that the ejector device 140 can releasably engage the lower surface 125a of the dicing tape 124 below an individual semiconductor die 152. Accordingly, in some embodiments, the ejector device 140 can pull the individual semiconductor die 152 toward the ejector device 140 prior to the ejector device 140 pushing the semiconductor die 152 upward, to further facilitate removing just one semiconductor die 152 at a time. In some embodiments, the vacuum source 170 can be further coupled to the support member 110 to hold the support substrate 120 (e.g., the dicing frame 122) in position relative to the support member 110. In other embodiments, the system 100 can include multiple vacuum sources, for example, one to hold the support substrate 120 in position, another to releasably engage the lower surface 125a of the dicing tape 124, and/or another to hold the semiconductor die 152 in contact with the pick tip 134. In other embodiments, the support substrate 120 can be fastened or fixed to the support member by other mechanical mechanisms. For example, the dicing frame 122 can be secured to the support member 110 via clips, fasteners, adhesives, etc.

In order to remove each of the semiconductor dies 152 one at a time, the system 100 is configured to provide for relative movement between the support member 110, and the pick head 132 and ejector device 140. That is, the position of the support member 110 relative to the pick head 132 and ejector device 140 is variable so that each semiconductor die 152 may be positioned at the pick station 111 for removal. Accordingly, in some embodiments, the support member 110 can be actuated to translate relative to one or more axes (e.g., along one or more the axes indicated by reference numerals X, Y and Z). In addition to or in lieu of the support member 110 moving, the picking device 130 can move via a guide 136 or other suitable device. Accordingly, the pick tip 134 can translate along one or more axes (e.g., along the three axes X, Y and Z). Similarly, in some embodiments, the ejector device 140 can be configured to move relative to the support member 110 via a separate guide or device (not pictured) such that it can be positioned below the pick tip 134 at the pick station 111. In certain embodiments, the ejector device 140 is configured to translate along only a single axis (e.g., along the axis Z). In some such embodiments, the ejector device 140 is moved away from the support substrate 120 along the axis Z after an individual semiconductor die 152 is removed, and moved toward the support substrate 120 to contact the support substrate 120 before a subsequent semiconductor 152 (e.g., a neighboring semiconductor die 152) is removed. Once semiconductor dies 152 are removed by the picking device 130, the removed semiconductor dies can be placed at another location within the overall system 100, or can be transferred outside the system 100.

The system 100 can further include a cold fluid source 180 that supplies a cold fluid to the cooling member 160 for facilitating the release of individual semiconductor dies 152 from the support substrate 120. Further details of the cooling member 160 and release operation are described later with reference to FIGS. 2A-4.

In some embodiments, the system 100 includes a controller 190 programmed with instructions for directing the operations and motions carried out by the support member 110, the picking device 130, the ejector device 140, the cooling member 160, and/or other components of the system 100. Accordingly, the controller 190 can include a processor, memory, input/output devices, and a computer-readable medium containing instructions for performing some or all of the tasks described herein.

Figure 2A:
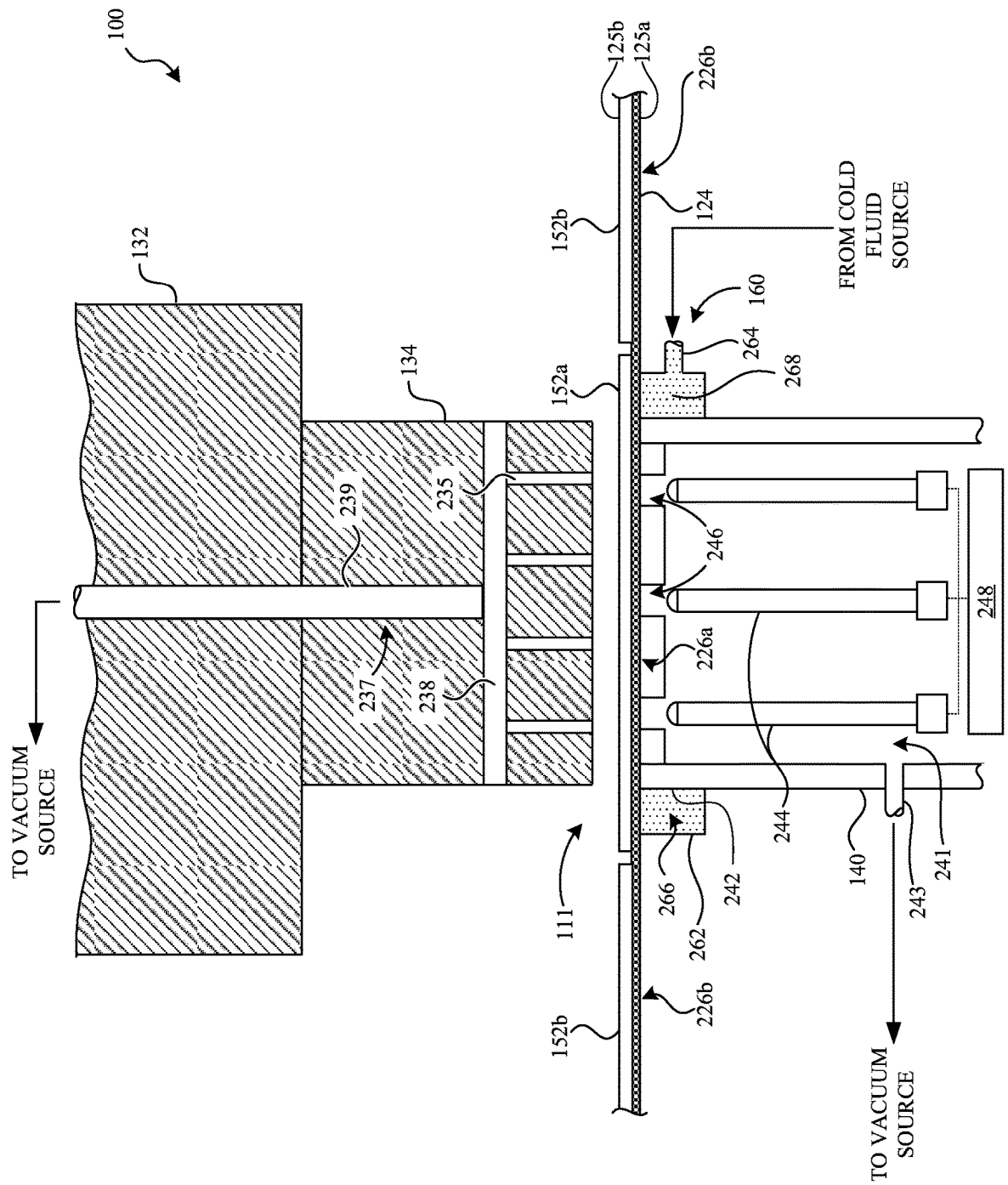
FIGS. 2A-2C are partially schematic, enlarged, cross-sectional views of a portion of the system shown in FIG. 1, including a cooling member configured in accordance with an embodiment of the present technology.
Figure 2B:
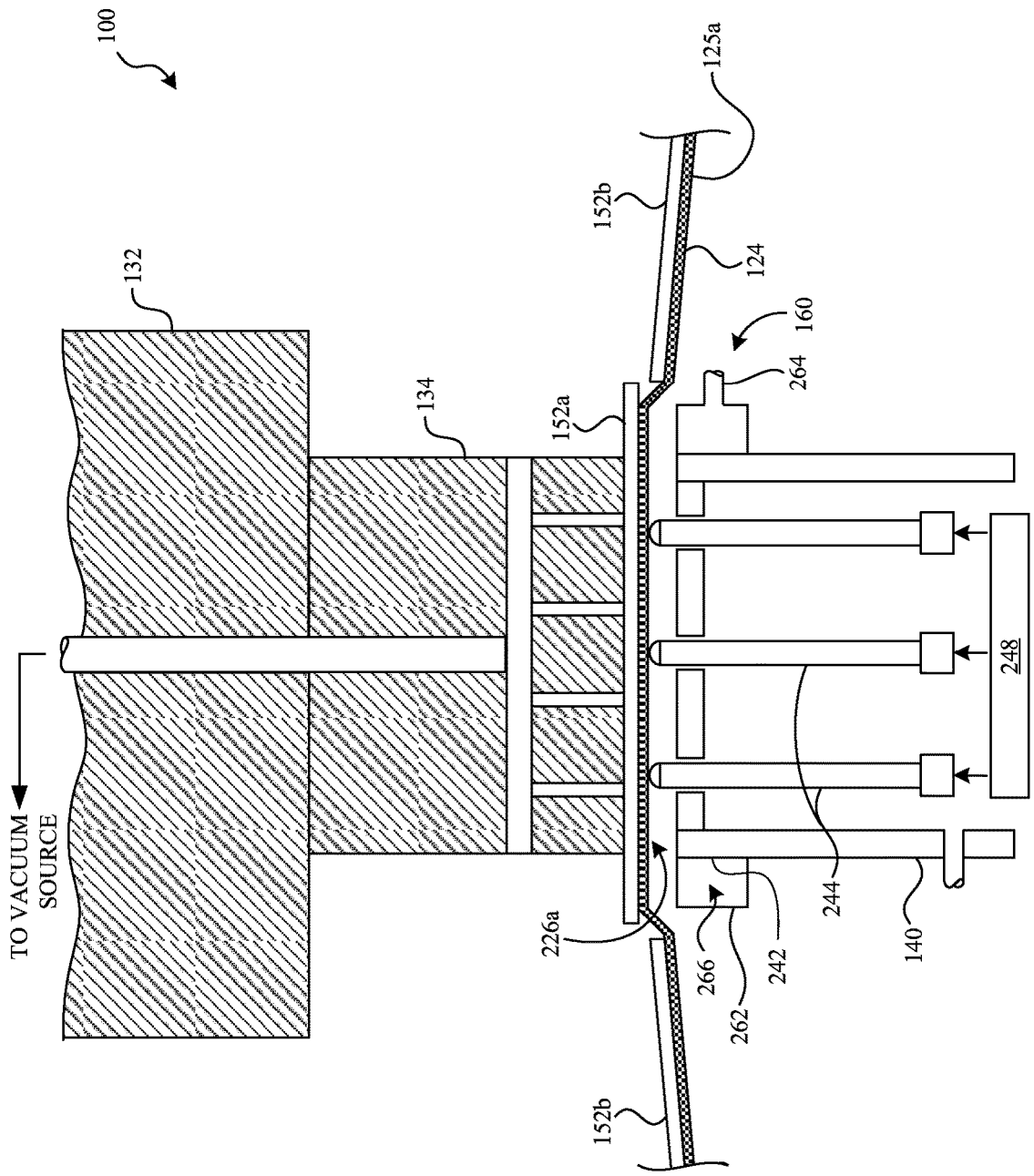
Figure 2C:
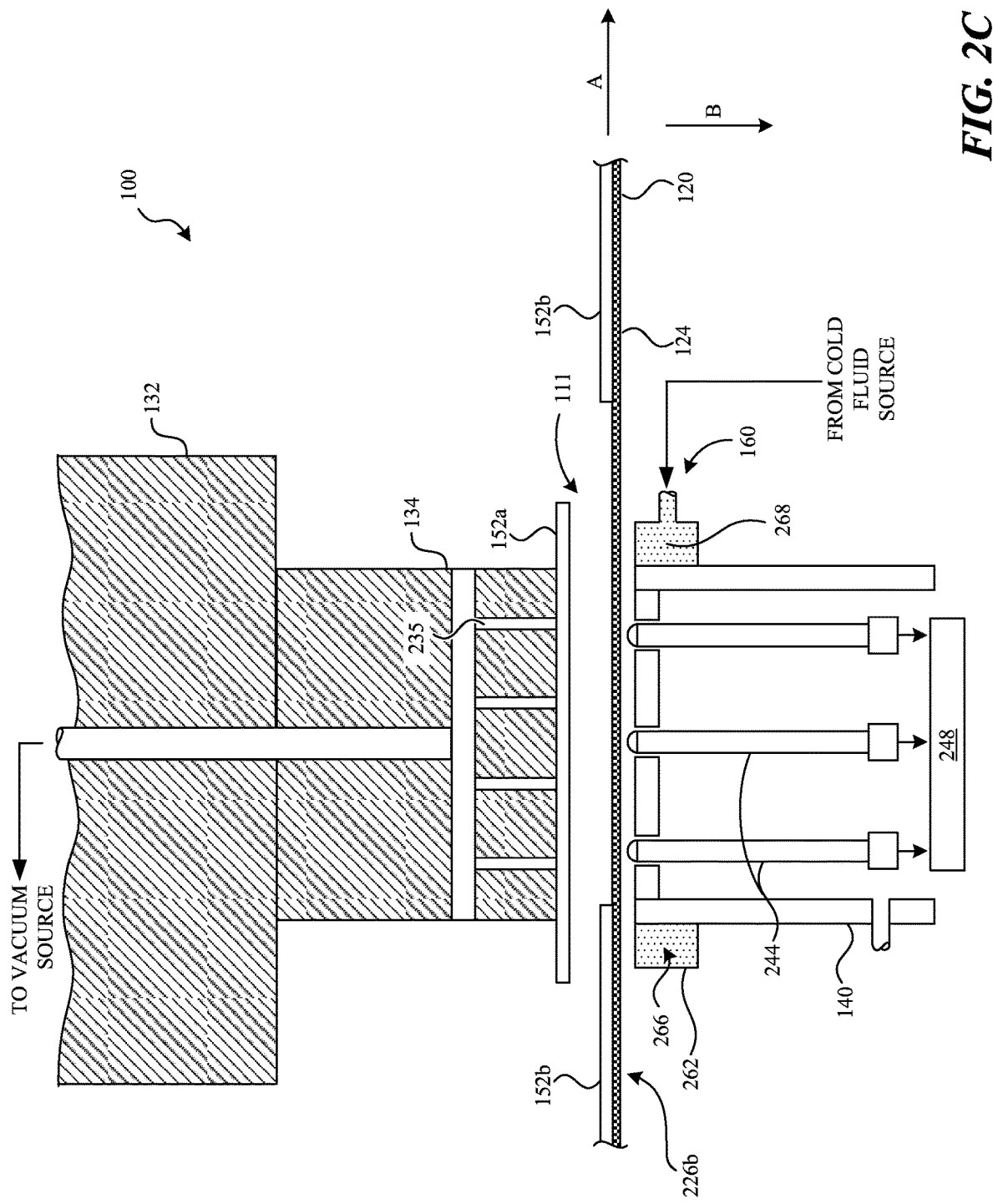

FIGS. 2A-2C are enlarged, partially schematic, cross-sectional views of a portion of the system 100 shown in FIG. 1 at different stages in a pick and place operation for removing a semiconductor die. FIG. 2A illustrates multiple semiconductor dies 152 attached to the upper surface 125b of the dicing tape 124, including a first semiconductor die 152a (in position at the pick station 111) and two neighboring second semiconductor dies 152b. More specifically, the dicing tape 124 can include a plurality of die attach regions below and/or proximate to individual ones of the semiconductor dies 152, and each individual semiconductor die 152 can be attached to the dicing tape 124 at a corresponding die attach region of the dicing tape 124. For example, the first semiconductor die 152a can be attached to the dicing tape 124 at a first die attach region 226a, and the second semiconductor dies 152b can be attached to the dicing tape 124 at second die attach regions 226b. As illustrated in FIG. 2A, the pick tip 134 of the pick head 132 has yet to engage the first semiconductor die 152a at the pick station 111.

The pick tip 134 can include multiple vacuum ports 235 coupled to a vacuum source (e.g., the vacuum source 170 of FIG. 1) via a vacuum flow path 237. The vacuum ports 235 can be individual passages (as shown in FIGS. 2A-2C), or can have other configurations. For example, the pick tip 134 can include or be formed from a foam that is porous so as to allow vacuum forces to act on the first semiconductor die 152a. The vacuum flow path 237 can include a plenum 238 in fluid communication with one or more of the vacuum ports 235, and a conduit or other passageway 239 that extends from the vacuum ports 235 to a suitable point for a connection to the vacuum source 170. When the vacuum source 170 is activated, the first semiconductor die 152a is releasably secured in contact with the pick tip 134 of the pick head 132 via the vacuum ports 235.

The ejector device 140 includes an upper portion or dome 242 positioned at the pick station 111. The first semiconductor die 152a and the corresponding first die attach region 226a of the dicing tape 124 are positioned over the dome 242 at the pick station 111. In the embodiment illustrated in FIGS. 2A-2C, the dome 242 includes an internal chamber 241 and one or more ejector pins 244 at least partially within the chamber 241. The dome 242 further includes a plurality of apertures 246 extending through an upper surface of the dome 242 and aligned with the ejector pins 244. The ejector pins 244 are configured to be actuated via one or more actuators 248 to extend upwardly through corresponding apertures 246 in the dome 242 to contact the lower surface 125a of the dicing tape 124 at the first die attach region 226a. As shown in FIG. 2A, the ejector pins 244 are in a non-actuated position within the ejector device 140 and the first semiconductor die 152a is positioned generally coplanar with the neighboring second semiconductor dies 152b. The ejector device 140 can further include at least one vacuum port 243 fluidly coupled to a vacuum source (e.g., the vacuum source 170 of FIG. 1) and providing a fluid pathway between the vacuum source and the chamber 241 of the ejector device 140. When the vacuum source is activated, the lower surface 125a of the dicing tape 124 at the first die attach region 226a is releasably secured in contact with the dome 242 via a suction or vacuum force exerted through the apertures 246 and/or additional apertures (not pictured) in the dome 242. In some embodiments, the suction or vacuum force can pull the first semiconductor die 152a downwards such that is lowered relative to the neighboring second semiconductor dies 152b.

The cooling member 160 can include a cooling structure 262 positioned at the pick station 111 and configured (e.g., shaped and positioned) to direct a cold fluid 268 toward the dicing tape 124 at the first die attach region 226a to cool the dicing tape 124 at the first die attach region 226a. The cooling structure 262 defines a cavity 266 (e.g., a chamber) and can surround at least a portion of the ejector device 140. More particularly, the cooling structure 262 can have a generally annular shape and can be attached to an exterior surface of the dome 242 of the ejector device 140. For example, the cooling structure 262 can be a ring having a circular, oval, polygonal, or other shape that matches the exterior shape of the ejector device 140 such that the cooling structure 262 can be snugly installed onto the ejector device 140. In some embodiments, the cooling structure 262 can be removably attached or permanently affixed to the ejector device 140. In this manner the cooling member 160 can be configured for installation into existing pick and place systems, for example, having conventional or previously manufactured ejector devices. In other embodiments, the cooling structure 262 can be integrally formed with the ejector device 140.

The cavity 266 is configured to receive the cold fluid 268 from a cold fluid source (e.g., the cold fluid source 180 of FIG. 1). In some embodiments, a port 264 in the cooling structure 262 fluidly connects the cavity 266 to the cold fluid source 180 which supplies the cold fluid 268. The cooling structure 262 can alternatively or additionally be fluidly coupled to the cold fluid source 180 via one or more pipes, conduits, or other fluid passageways that are not pictured in FIGS. 2A-2C. At least a portion of the cavity 266 is positioned adjacent to at least a portion of the first die attach region 226a so that the cold fluid 268 can cool the dicing tape 124. For example, in the illustrated embodiment, the cavity 266 is positioned adjacent to an outer portion (e.g., an outer annular portion) of the first die attach region 226a of the dicing tape 124, since the cooling structure 262 is positioned around the ejector device 140. Depending on the relative sizes of the cooling structure 262 and the ejector device 140, the cavity 266 can be positioned adjacent to more or less of the first die attach region 226a. The cold fluid 268 at least partially fills the cavity 266 when the cold fluid source 180 is activated, which allows the cold fluid 268 to cool the portion of the first die attach region 226a of the dicing tape 124 that is adjacent to the cavity 266 via heat transfer away from the dicing tape 124. That is, the cooling structure 262 directs the cold fluid 268 toward a portion of the lower surface 125a of the dicing tape 124 at the first die attach region 226a to cool (e.g., freeze) the die attach region 226a of the dicing tape 124.

In some embodiments, the cooling structure 262 is a closed structure such that cavity 266 is a sealed chamber. In such embodiments, the cold fluid 268 does not directly contact the dicing tape 124 when the cold fluid source 180 is activated. Rather, the cold fluid 268 indirectly cools the dicing tape 124 at the first die attach region 226a by cooling the cooling structure 262 which is in contact with and/or proximate to the dicing tape 124. In other embodiments, the cooling structure 262 is not a closed structure such that the cold fluid 268 can directly flow against and contact the lower surface 125a of dicing tape 124 when the cold fluid source 180 is activated. For example, in some embodiments, the lower surface 125a of the dicing tape 124 is positioned directly above the cavity 266 when the lower surface 125a is releasably secured in contact with the dome 242 via the suction or vacuum force exerted through the apertures 246. The dicing tape 124 can therefore enclose the cavity 266 to provide a sealed or partially sealed region in which the cold fluid 268 can contact and cool the dicing tape 124.

The cold fluid 268 supplied by the cold fluid source 180 can be any suitable fluid (e.g., air, nitrogen, etc.) and can be in a liquid and/or gaseous state. In some embodiments, the cold fluid source 180 is a cold air cannon configured to flow cold air into the cooling structure 262 through the port 264 and/or other fluid passageways (not pictured). In certain embodiments the cold air from the cold air cannon has a temperature of about −12° Celsius or lower than about −12° Celsius. In other embodiments, the cold fluid 268 is liquid nitrogen.

Cooling the dicing tape 124 at the first die attach region 226a facilitates the release of the first semiconductor die 152a from the dicing tape 124 by, for example, loosening the attachment forces between the first semiconductor die 152a and the dicing tape 124, and/or otherwise weakening the bond(s) (e.g., electrostatic, mechanical and/or other bonds) between these two components. Thus, the pick head 132 can more easily lift the first semiconductor die 152a away from the dicing tape 124 without breaking the first semiconductor die 152a (FIG. 2C). In some embodiments, lowering the temperature of the dicing tape 124 causes the dicing tape 124 to freeze, reduces the tackiness of the dicing tape 124, shrinks the dicing tape 124, reduces the adhesiveness of the dicing tape 124, and/or makes the dicing tape 124 more brittle. The temperature reduction of the dicing tape 124 and the resulting physical changes can depend on the type and quantity of the cold fluid 268, the properties of the dicing tape 124, the length of time the dicing tape 124 is exposed to the cold fluid 268, etc. In some embodiments, the cooling member 160 can sufficiently loosen the bonds between the dicing tape 124 and the first semiconductor die 152a after the first semiconductor die 152a has been at the pick station 111 for only a few seconds. However, this time may vary in embodiments where the factors listed above differ.

FIG. 2B illustrates the system 100 after the pick tip 134 of the pick head 132 has engaged the first semiconductor die 152a, and after the ejector pins 244 have been actuated upwardly by the one or more actuators 248 to contact the lower surface 125a of the dicing tape 124 at the first die attach region 226a. When the ejector pins 244 are extended upwardly, the first semiconductor die 152a is raised relative to the neighboring second semiconductor dies 152b. This arrangement can make it easier for the pick head 132 to retrieve one semiconductor die at a time. Moreover, in some embodiments, because the cooling member 160 cools the dicing tape 124 at the first die attach region 226a prior to actuation of the ejector pins 244, the ejector pins 244 can help facilitate the release of the first semiconductor die 152a. For example, the contact force of the ejector pins 244 against the cooled dicing tape 124 can loosen or break the bond(s) between the dicing tape 124 and the first semiconductor die 152a and cause at least a portion of the dicing tape 124 at the first die attach region 226a to peel away from or otherwise release from the first semiconductor die 152a. In some embodiments, the ejector pins 244 are first actuated while the lower surface 125a of the dicing tape 124 is releasably secured in contact with the dome 242 of the ejector device 140 via a suction or vacuum force, as described above. This combination of a downward suction force and upward force resulting from the ejector pins 244 can further cause the cooled dicing tape 124 to release from the first semiconductor die 152a.

As further illustrated in FIG. 2B, in some embodiments the cold fluid 268 (FIG. 2A) no longer fills the cavity 266 of the cooling structure 262 after the ejector pins 244 are actuated upward and/or after the pick head 132 engages the first semiconductor die 152a. For example, in certain embodiments, the cold fluid 268 (e.g., that is warmed by the induced heat transfer from the dicing tape 124) is vented or exhausted through the port 264 and/or other portions of the cooling member 160. In embodiments where the cooling structure 262 is not a sealed or closed structure, the cold fluid 268 is free to flow from the cavity 266 and out of the cooling structure 262. In yet other embodiments, the cooling member 160 can be a closed system in which the cold fluid 268 is returned from the cooling structure 262 to the cold fluid source 180 (e.g., via a second port in the cooling structure 262).

FIG. 2C illustrates the system 100 after the first semiconductor die 152a has been fully released from the dicing tape 124, and during translation of the support substrate 120 (e.g., the dicing tape 124 and dicing frame 122) in the direction of arrow A. The first semiconductor die 152a is secured in contact with the pick tip 134 of the pick head 132 via the vacuum ports 235. As described above, the pick head 132 can be movable relative to the support substrate 120 and/or ejector device 140 such that the first semiconductor die 152a can be moved away from the pick station 111 and to a release station (not pictured; e.g., at a station configured for further processing). Similarly, the support substrate 120 can be movable such that another semiconductor die 152 (e.g., the leftmost neighboring second semiconductor die 152b) can be positioned at the pick station 111, as shown in FIG. 1. Moreover, the ejector device 140 can be movable in at least one direction relative to the support substrate 120 to, for example, permit movement of the support substrate 120 without interference from the ejector device 140. For example, in the embodiment shown in FIG. 2C, the ejector device 140 has been moved downwards relative to the support substrate 120 in the direction of arrow B to permit free movement of the support substrate 120. When the neighboring second semiconductor die 152b is in position at the pick station 111, the ejector device 140 can be moved upwards to contact the dicing tape 124 as shown in FIG. 2A. Moreover, as shown in FIG. 2C, the actuators 248 can retract (e.g., actuate downwardly) the ejector pins 244 prior to positioning of the second semiconductor die 152b at the pick station 111.

The cooling member 160 can at least partially refill the cavity 266 of the cooling structure 262 with the cold fluid 268 while the pick head 132 moves the first semiconductor die 152a to the release station and/or while the neighboring second semiconductor die 152b is moved to the pick station 111. The cooling member 160 can therefore cool the die attach region 226b beneath the neighboring second semiconductor die 152b as soon as the die attach region 226b is positioned at the pick station 111. In other embodiments, the cooling member 160 can be configured to supply the cold fluid 268 to the cooling structure 262 only after the support substrate 120 is repositioned.

FIG. 3 is an enlarged, partially schematic, cross-sectional view illustrating a portion of the system 100 shown in FIG. 1 having a cooling member 360 configured in accordance with another embodiment of the present technology. The cooling member 360 may be provided in lieu of or in addition to the cooling member 160 of FIGS. 2A-2C. The cooling member 360 is integrated with the ejector device 140 and includes at least one port 364 that fluidly connects the chamber 241 of the ejector device 140 to a cold fluid source (e.g., the cold fluid source 180 of FIG. 1). In some embodiments, the cold fluid source 180 is fluidly coupled to the port 364 via one or more pipes, conduits, or other fluid passageways that are not pictured in FIG. 3. Accordingly, the cold fluid 268 supplied by the cold fluid source 180 can at least partially fill the chamber 241 when the cold fluid source 180 is activated. One or more cooling apertures 346 in the dome 242 of the ejector device 140, and/or the apertures 246 (corresponding to the ejector pins 244), can direct the cold fluid 268 toward a portion of the lower surface 125a of the dicing tape 124 at the first die attach region 226a to the cool the first die attach region 226a. In some embodiments, the cold fluid source 180 can be activated after or before a vacuum source (e.g., the vacuum source 170) fluidly coupled to the chamber 241 such that the cold fluid 268 is not removed from the chamber 241 as a result of the vacuum pressure within the chamber 241. In other embodiments, the ejector device 140 can include at least two internal chambers—one fluidly coupled to a vacuum source and another fluidly coupled to a cold fluid source—each having corresponding apertures in the dome 242 to permit interaction with the dicing tape 124.

In some embodiments, the cooling member 360 allows for a more even cooling of the first die attach region 226a of the dicing tape 124 than the cooling member 160 illustrated in FIGS. 2A-2C. In particular, directing the cold fluid 268 toward the lower surface 125a of the dicing tape 124 through the cooling apertures 346 allows the cold fluid 268 to contact an interior portion (e.g., nearer the center of the first semiconductor die 152a) of the first die attach region 226a. Such an interior portion may not be directly above the cavity 266 of the cooling member 160, and therefore not directly cooled by the cooling member 160. However, it may be more difficult to modify existing pick and place systems to include the cooling member 360 as compared to the cooling member 160. For example, as described above, in some embodiments the cooling member 160 can be integrated into existing pick and place systems either without modification or with relatively minor modifications.

Each of the embodiments illustrated in FIGS. 2A-3 share the advantage that they direct a cold fluid towards a lower surface of 125a of the dicing tape 124—rather than the upper surface 125b to which the semiconductor dies 152 are attached. Thus, the cold fluid 268 does not directly contact the semiconductor dies 152 which could potentially damage or contaminate the dies. However, some embodiments of the present technology include a cooling member configured to direct a cold fluid toward the upper surface 125b of the dicing tape 124 at the first die attach region 226a and/or toward the first semiconductor die 152a.

Figure 4:
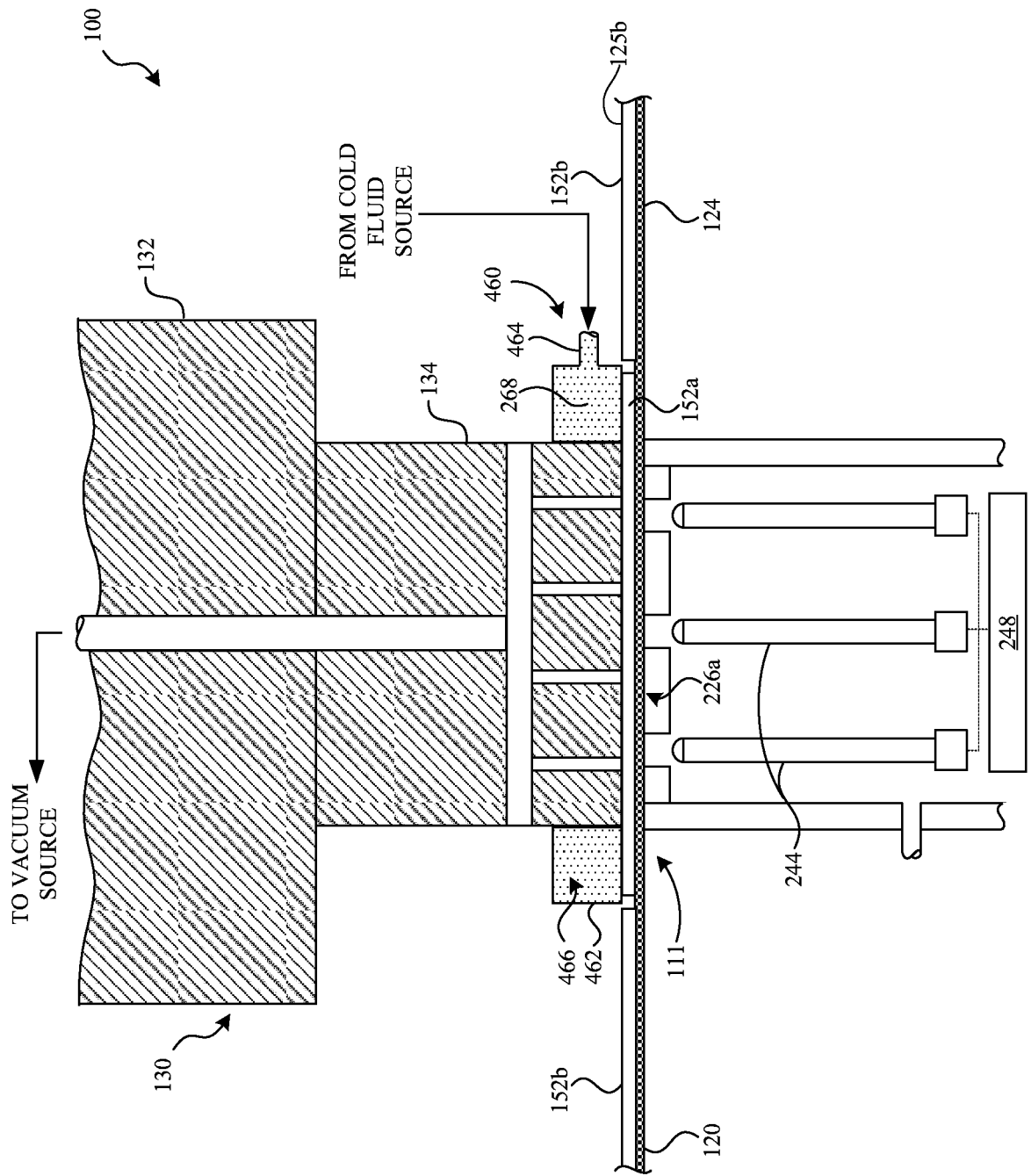
FIG. 4 is a partially schematic, enlarged, cross-sectional view of a portion of the system shown in FIG. 1, including a cooling member configured in accordance with another embodiment of the present technology.

For example, FIG. 4 is an enlarged, partially schematic, cross-sectional view illustrating a portion of the system 100 shown in FIG. 1 having a cooling member 460 configured in accordance with another embodiment of the present technology. The cooling member 460 may be provided in lieu of or in addition to the cooling member 160 of FIGS. 2A-2C and/or the cooling member 360 of FIG. 3. The cooling member 460 can have some features generally similar to those of the cooling member 160. For example, the cooling member 460 can include a cooling structure 462 positioned at the pick station 111 and defining a cavity 466 (e.g., a chamber), and can be configured to cool the die attach region 226a of the dicing tape 124. In contrast to the cooling member 160, the cooling member 460 is positioned above the support substrate 120 (e.g., above the dicing tape 124). For example, in the embodiment illustrated in FIG. 4, the cooling member 460 surrounds at least a portion of the pick head 132 of the picking device 130 and is configured to direct a cold fluid (e.g., the cold fluid 268) toward the first semiconductor die 152a and/or the upper surface 125b of the dicing tape 124. More particularly, the cooling structure 462 can have an annular shape and can be permanently or releasably attached to an exterior surface of the pick tip 134 of the pick head 132. In other embodiments, the cooling member 460 can be coupled to the picking device 130 differently or otherwise positioned differently above the support substrate 120 for directing the cold fluid toward the first die attach region 226a of the dicing tape 124 (e.g., toward the first semiconductor die 152a). The cooling member 460 can further include a port 464 fluidly coupled to a cold fluid source (e.g., the cold fluid source 180), which supplies the cavity 466 of the cooling member 460 with the cold fluid 268.

In the embodiment illustrated in FIG. 4, the pick tip 134 is releasably engaged to the first semiconductor die 152a at the pick station 111, and the ejector pins 244 have yet to be actuated upwardly by the actuators 248. The cavity 466 of the cooling member 460 is positioned adjacent to at least a portion of the first semiconductor die 152a and/or the upper surface 125b of the dicing tape 124. For example, in the illustrated embodiment, the cavity 466 is positioned adjacent to an outer portion (e.g., an outer annular portion) of the first semiconductor die 152a and above an outer annular portion of the first die attach region 226a dicing tape 124 (e.g., the exposed region of dicing tape 124 between the first semiconductor die 152a and the neighboring second semiconductor dies 152b). The cold fluid 268 at least partially fills the cavity 266 when the cold fluid source 180 is activated, which allows the cold fluid 268 to cool the first semiconductor die 152a and/or the exposed portion of the dicing tape 124. Cooling the first semiconductor die 152a indirectly cools the first die attach region 226a of the dicing tape 124 to facilitate the release of the first semiconductor die 152a.

One feature of at least some of the systems and methods described above with reference to FIGS. 1-4 is that a cold fluid is used to at least weaken (e.g., weaken or break) the bonds between a semiconductor die or other semiconductor device, and an underlying dicing tape or other support substrate. By at least reducing these forces, the likelihood for the picking device to consistently remove the semiconductor dies without breaking or otherwise damaging them can be significantly improved. This is particularly advantageous in situations where the semiconductor dies are extremely thin (e.g., 100 microns thick, or thinner). Accordingly, the yield for such thin dies can be significantly improved. This arrangement can provide advantages in a production environment, in which high yield has a clear production benefit, and/or a research environment, in which the number of available dies for testing may be limited, and each broken or damaged die can significantly impede advances in the associated research.

Figure 5:
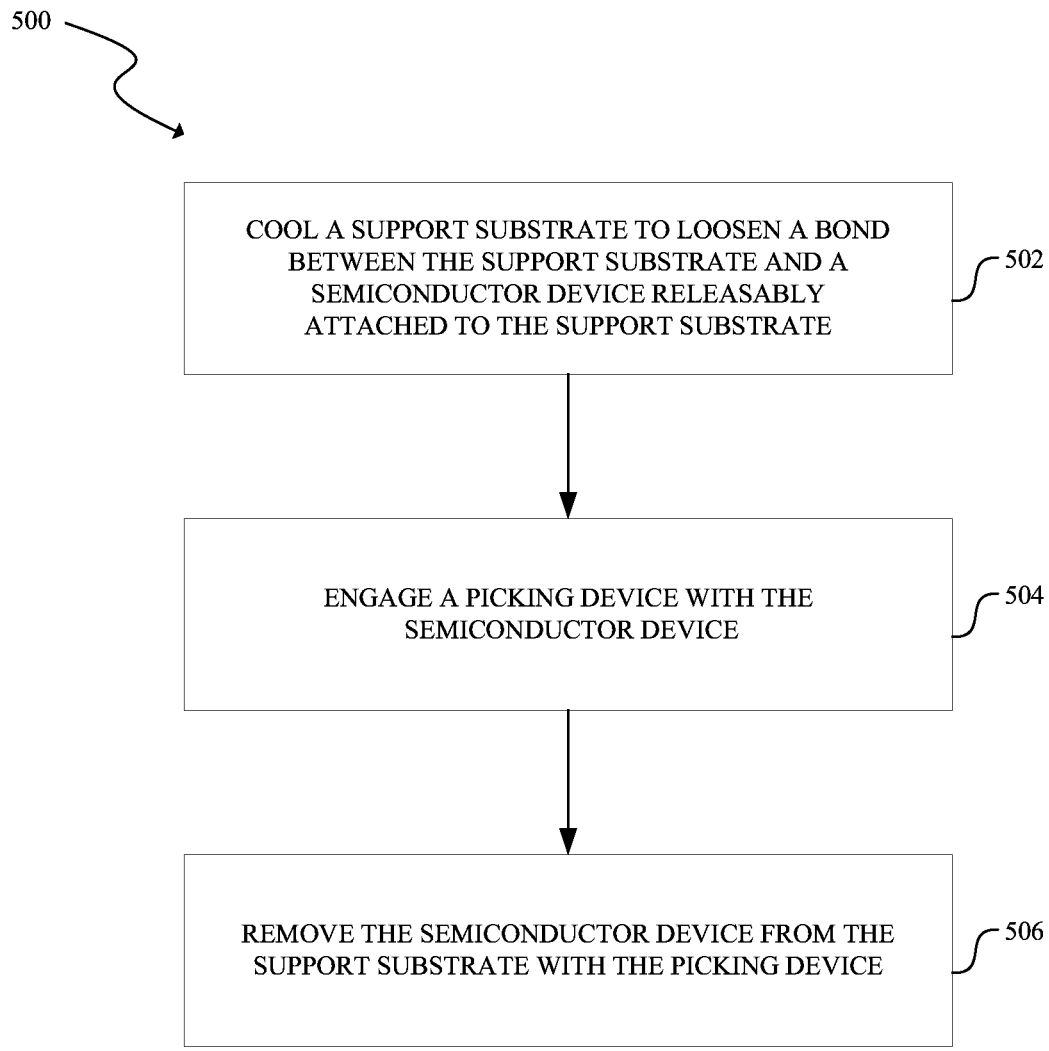
FIG. 5 is a flow diagram of a process or method for handling a semiconductor device in accordance with an embodiment of the present technology.

FIG. 5 is a flow diagram of a process or method 500 for handling semiconductor devices in accordance with an embodiment of the present technology. The process 500 can be carried out, for example, using one or more of the handling systems described above with reference to FIGS. 1-4. Beginning at block 502, the process 500 comprises cooling a support substrate to loosen a bond between the support substrate and a semiconductor device (e.g., a singulated semiconductor die) releasably attached to the support substrate. For example, the support substrate can include a dicing tape with the semiconductor device releasably attached thereto, and cooling the support substrate can include directing a cold fluid toward the dicing tape proximate to where the semiconductor device is releasably attached to the dicing tape. At block 504, the process includes engaging a picking device with the semiconductor device. At block 506, the process includes removing the semiconductor device from the support substrate (e.g., from a dicing tape) with the picking device. In some embodiments, cooling the support substrate (block 502) before removing the semiconductor device with the picking device (block 506) reduces the likelihood that the semiconductor device will be damaged during removal from the support substrate. In certain embodiments, the picking device engages the semiconductor device (block 504) before the support substrate is cooled (block 502).

From the foregoing, it will be appreciated that specific embodiments of the present technology have been described herein for purposes of illustration, but that various modifications may be made without deviating from the scope of the present technology. For example, in particular embodiments, the details of the picking device and/or the cooling member may be different than those shown in the foregoing Figures. In some embodiments, the various embodiments may be combined to, for example, to incorporate more than one cooling member. In particular embodiments, the cold fluids used to release individual dies from the associated dicing tape, or other supporting component, may be different or have different compositions than those expressly disclosed herein. The cold fluid can be delivered from a cooling member installed on or integrated with an ejector device, or from any cooling member configured to deliver or direct the cold fluid toward the dicing tape or other supporting component. Accordingly, the cooling member can be positioned above or below the support substrate. The support substrate can be configured to support the semiconductor device via a dicing tape, as described in connection with several embodiments above, or via other releasable media or mechanisms. In particular embodiments (e.g., when the support substrate includes a dicing tape), the forces released by the cold fluid are primarily electrostatic and/or mechanical forces, and in other embodiments, the forces may be of different types, in addition to or in lieu of electrostatic and/or mechanical forces. In any of these embodiments, the forces may vary depending on factors that include the type and/or age of the support substrate, the roughness of the wafer backside, the presence or absence of residual seed layer material, the nature of the process most recently completed on the wafer, and/or other factors. The pick and place operation can be performed immediately after dicing, or in association with other processes, e.g., thermocompression bonding, die sorting, and/or flip chip tool operations. The pick and place operation performed by the systems described herein, including the operation of the cooling member, can be controlled (e.g., by an automated controller). The system may be used just prior to a die packaging operation, and/or at any suitable step in the fabrication process for which the pick and place operation is used.

Certain aspects of the technology described in the context of particular embodiments may be combined or eliminated in other embodiments. Further, while advantages associated with certain embodiments have been described in the context of those embodiments, other embodiments may also exhibit such advantages and not all embodiments need necessarily exhibit such advantages to fall within the scope of the present technology. Accordingly, the present disclosure and associated technology can encompass other embodiments not expressly shown or described herein.

We claim:

1. A system for handling semiconductor dies, comprising:
    a support member positioned to carry at least one semiconductor die releasably attached to a die attach region of a support substrate;
    a picking device having a vacuum pick head and positioned to pick the semiconductor die at a pick station;
    an ejector device at the pick station, wherein the support substrate is positioned between the pick head and the ejector device, and wherein the ejector device includes one or more ejector pins coupled to an actuator and configured to move upwardly to contact a lower surface of the support substrate;
    a cooling structure positioned at the pick station below the support substrate, wherein the cooling structure has an annular shape and is positioned around the ejector device; and
    a cooling member configured to direct a cold fluid into the cooling structure to cool the die attach region at the pick station.

2. The system of claim 1 wherein the support substrate includes a frame carrying a dicing tape.

3. The system of claim 1 wherein the cold fluid is a gas having a temperature of about or less than about −12 degrees Celsius.

4. A method for handling semiconductor dies, comprising:
    flowing a cold fluid into a cooling structure positioned beneath a support substrate to cool the substrate and loosen a bond between the support substrate and a singulated semiconductor die releasably attached to the support substrate;
    moving an ejector pin of an ejector device into contact with a lower surface of the support substrate to elevate at least a portion of the singulated semiconductor die, wherein the cooling structure has an annular shape and is positioned around the ejector device;
    engaging a picking device with the singulated semiconductor die; and
    removing the singulated semiconductor die from the support substrate with the picking device.

5. The method of claim 4 wherein the support substrate includes a dicing frame and a dicing tape, wherein the singulated semiconductor die is attached to the dicing tape at a die attach region of the dicing tape, and wherein the method further comprises directing the cold fluid from the cooling structure toward the die attach region.

6. The method of claim 4 wherein engaging the picking device with the singulated semiconductor die is performed before cooling flowing the cold fluid into the cooling structure.

7. The method of claim 4 wherein engaging the picking device with the singulated semiconductor die is performed after flowing the cold fluid into the cooling structure.

8. The method of claim 4, further comprising:
    releasably attaching at least a portion of a semiconductor wafer to the support substrate; and
    singulating semiconductor dies of the semiconductor wafer while the semiconductor wafer is attached to the support substrate.

9. A system for handling semiconductor dies, comprising:
    a support member positioned to carry a semiconductor wafer, the semiconductor wafer having a plurality of semiconductor dies releasably attached to a dicing tape carried by a dicing frame;
    a picking device having a vacuum pick head, the pick head positioned above the semiconductor wafer and configured to pick individual ones of the semiconductor dies at a pick station;
    an ejector device positioned below the semiconductor wafer at the pick station and having at least one ejector pin configured to move upwardly to contact a portion of the dicing tape at the pick station to elevate an individual semiconductor die attached to the portion of the dicing tape at the pick station relative to neighboring ones of the semiconductor dies;
    a cooling structure positioned at the pick station below the semiconductor wafer, wherein the cooling structure has an annular shape and is positioned around the ejector device; and
    a cold fluid source configured to flow a cold fluid into the cooling structure to cool the portion of the dicing tape at the pick station, wherein the cold fluid has a temperature of about −12° Celsius or lower.

10. The system of claim 8 wherein the semiconductor dies are releasably attached to an upper surface of the dicing tape.

11. The system of claim 8 wherein the cold fluid loosens a bond between the semiconductor dies and the dicing tape.

12. The system of claim 8 wherein the cooling structure defines an opening below the support member, and wherein the cold fluid is directed toward the portion of the dicing tape at the pick station via the opening.

13. The system of claim 8 wherein the cold fluid is a liquid that contacts the dicing tape.

14. The system of claim 9 wherein the support member is configured to move the semiconductor wafer relative to the picking device and the ejector device to position an individual semiconductor die at the pick station.

15. The system of claim 9 wherein the cold fluid is cold air, and wherein the cold fluid source is a cold air cannon configured to flow the cold air toward the dicing tape.

16. The system of claim 9 wherein the pick head includes multiple vacuum ports.

17. The system of claim 16 wherein the vacuum ports are each fluidly connected to a common plenum that is fluidly coupled to a vacuum source.

* * * * *